United States Patent [19]

Weiss et al.

[11] Patent Number: 5,538,806
[45] Date of Patent: *Jul. 23, 1996

[54] BATTERY WITH TESTER LABEL AND METHOD FOR PRODUCING IT

[75] Inventors: Victor H. Weiss, Plantation, Fla.; John G. Langbehn, Minnetonka; Dean A. Laird, Shakopee, both of Minn.; Gary R. Tucholski, Parma Hts.; Robert A. Prok, Columbia Station, both of Ohio

[73] Assignees: Morgan Adhesive Company; Eveready Battery Company, Inc., St. Louis, Mo.

[ * ] Notice: The term of this patent shall not extend beyond the expiration date of Pat. No. 5,389,458.

[21] Appl. No.: 377,178

[22] Filed: Jan. 24, 1995

Related U.S. Application Data

[63] Continuation of Ser. No. 56,160, May 3, 1993, Pat. No. 5,393,618.

[51] Int. Cl.⁶ ................................................. H01M 10/43
[52] U.S. Cl. ............................ 429/90; 429/91; 429/92; 429/93; 324/435
[58] Field of Search .................. 429/90, 91, 92, 429/93; 324/435

[56] References Cited

U.S. PATENT DOCUMENTS

| 394,100 | 12/1888 | Currie . |
| 945,564 | 1/1910 | Marko . |
| 1,497,388 | 6/1924 | Sterling . |
| 2,980,754 | 4/1961 | Reilly et al. . |
| 2,988,590 | 6/1961 | Andre . |

(List continued on next page.)

FOREIGN PATENT DOCUMENTS

| 0450938A2 | 10/1991 | European Pat. Off. . |
| 0450938A3 | 10/1991 | European Pat. Off. . |
| 0495636A2 | 7/1992 | European Pat. Off. . |
| 0495636A3 | 7/1992 | European Pat. Off. . |
| 0497616A2 | 8/1992 | European Pat. Off. . |
| 0501609A1 | 9/1992 | European Pat. Off. . |
| 923008452 | 10/1992 | European Pat. Off. . |
| 0523901A1 | 1/1993 | European Pat. Off. . |
| 923003198 | 2/1994 | European Pat. Off. . |
| 943031294 | 9/1994 | European Pat. Off. . |
| 943031344 | 9/1994 | European Pat. Off. . |
| 943039858 | 10/1994 | European Pat. Off. . |
| 57-153275 | 9/1982 | Japan . |
| 58-169768A | 10/1983 | Japan . |
| 58-174598 | 4/1985 | Japan . |
| 60-066170 | 4/1985 | Japan . |
| 53-128586 | 11/1985 | Japan . |
| 63-179269 | 7/1988 | Japan . |
| 63-213256 | 9/1988 | Japan . |
| 241365 | 3/1990 | Japan . |
| 2100269 | 4/1990 | Japan . |
| 2184884A | 7/1990 | Japan . |
| 313379 | 1/1991 | Japan . |
| 3123384A | 5/1991 | Japan . |
| 04329384A | 11/1992 | Japan . |
| 04329385A | 11/1992 | Japan . |
| 1153226 | 5/1969 | United Kingdom . |
| 2011698 | 7/1979 | United Kingdom . |
| 2282697 | 4/1995 | United Kingdom . |
| WO9213368 | 3/1991 | WIPO . |
| WO9203852 | 3/1992 | WIPO . |
| WO9306474 | 4/1993 | WIPO . |

OTHER PUBLICATIONS

Parker, Robert, *Solid State RMS Recording Ammeter*, Lawrence Livermore Laboratory, University of California (1972) (moth n/n).

Batcheck Advertisement/Instructions by Celgard, 13800 S. Lakes Dr., Charlotte, NC 6/1988 (month n/n).

*Primary Examiner*—M. Nuzzolillo
*Attorney, Agent, or Firm*—Robert W. Welsh

[57] ABSTRACT

A battery encased with a label containing an integral test circuit device that is activated by depressing a selected area of the label whereupon a thermally sensitive material displays whether the battery has capacity. A method for producing the test circuit device is also disclosed.

21 Claims, 2 Drawing Sheets

U.S. PATENT DOCUMENTS

| | | |
|---|---|---|
| 3,280,701 | 10/1966 | Donnelly et al. . |
| 3,500,372 | 3/1970 | Thiele . |
| 3,514,338 | 5/1970 | Korneliske Shakour Nee Eekma . |
| 3,563,806 | 2/1971 | Hruden . |
| 3,667,039 | 5/1972 | Garfein et al. . |
| 3,720,869 | 3/1973 | Rowlette . |
| 3,764,893 | 10/1973 | Weigand . |
| 3,773,563 | 11/1973 | Eaton, Jr. et al. . |
| 3,823,367 | 7/1974 | Kaye et al. . |
| 4,006,414 | 2/1977 | Parker . |
| 4,027,231 | 5/1977 | Lohrmann . |
| 4,060,666 | 11/1977 | Anes . |
| 4,118,112 | 10/1978 | Thornburg . |
| 4,173,733 | 11/1979 | Sugalski et al. . |
| 4,198,597 | 4/1980 | Sawyer . |
| 4,248,942 | 2/1981 | Eby et al. . |
| 4,316,185 | 2/1982 | Watrous et al. . |
| 4,360,780 | 11/1982 | Skutch, Jr. . |
| 4,365,241 | 12/1982 | Morishita . |
| 4,371,827 | 2/1983 | Mullersman et al. . |
| 4,379,816 | 4/1983 | Mullersman et al. . |
| 4,392,102 | 7/1983 | Sugalski et al. . |
| 4,421,560 | 12/1983 | Kito et al. . |
| 4,432,041 | 2/1984 | Pfisterer et al. . |
| 4,497,881 | 2/1985 | Bertolino . |
| 4,520,353 | 5/1985 | McAuliffe . |
| 4,536,757 | 8/1985 | Ijintema . |
| 4,560,937 | 12/1985 | Finger . |
| 4,626,765 | 12/1986 | Tanaka . |
| 4,680,527 | 7/1987 | Benenati et al. . |
| 4,702,563 | 10/1987 | Parker ............... 350/351 |
| 4,702,564 | 10/1987 | Parker ............... 350/351 |
| 4,723,656 | 2/1988 | Kiernan et al. . |
| 4,726,661 | 2/1988 | Parker . |
| 4,727,006 | 2/1988 | Malinowski et al. . |
| 4,737,020 | 4/1988 | Parker ............... 350/351 |
| 4,746,200 | 5/1988 | Kamigaki . |
| 4,801,514 | 1/1989 | Will et al. . |
| 4,835,475 | 5/1989 | Hanakura et al. ........ 324/435 |
| 4,835,476 | 5/1989 | Kurosawa . |
| 4,876,632 | 10/1989 | Osterhout et al. . |
| 4,902,108 | 2/1990 | Byker . |
| 4,911,994 | 3/1990 | Will et al. . |
| 4,917,973 | 4/1990 | Yoshimoto et al. . |
| 5,015,544 | 5/1991 | Burroughs et al. ........ 429/93 |
| 5,059,895 | 10/1991 | Cataldi et al. ........ 324/104 |
| 5,128,616 | 7/1992 | Palmer . |
| 5,130,658 | 7/1992 | Bohmer . |
| 5,132,176 | 7/1992 | Valentine et al. . |
| 5,156,931 | 10/1992 | Burroughs et al. ........ 429/93 |
| 5,188,231 | 2/1993 | Kivell et al. . |
| 5,223,003 | 7/1993 | Tucholski ............ 29/623.4 |
| 5,231,356 | 7/1993 | Parker . |
| 5,250,905 | 10/1993 | Kuo et al. . |
| 5,389,458 | 2/1995 | Weiss et al. . |
| 5,393,618 | 2/1995 | Weiss et al. ............ 429/90 |
| 5,409,788 | 4/1995 | Weiss et al. . |

BATTERY WITH TESTER LABEL AND METHOD FOR PRODUCING IT

This is a continuation of application Ser. No. 08/056,160, filed May 3, 1993, now U.S. Pat. No. 5,393,618.

FIELD OF THE INVENTION

The invention relates to a battery tester device that forms an integral part of the label encasing a battery.

BACKGROUND OF THE INVENTION

Batteries are generally stored for various periods of time before being put into use. The batteries can be stored by the seller and frequently when purchased they are again stored by the buyer prior to being put to use. It is therefore desired to have some sort of testing means for determining if a battery has sufficient charge to operate a desired device. Initially, separate battery testers were developed which could measure the strength remaining in the battery. Recently battery testers have been developed that either are included in the battery package or assembled in the label secured to the battery. The testers generally indicate the capacity remaining in the battery.

U.S. Pat. No. 4,702,564 discloses a device for testing a battery, particularly a small, portable battery, comprising a flexible, transparent substrate on which is deposited a narrow band of a black light absorbing material. A conductive material, which may taper outwardly in opposite directions from a central point to a pair of outer terminals, is then deposited atop the substrate on the same side of the substrate as the absorber layer or on the opposite side of the substrate as the absorber layer. A layer of a chloesteric liquid crystal material is then deposited on the substrate on the opposite side from the black absorber layer or over the absorber layer. The conductive material is an epoxy cement-based conductor, preferably silver, printed or painted directly on the substrate. An indicator scale is located along sections of the conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly. The tester also includes means for determining the amp-hours or life of a battery.

U.S. Pat. No. 5,015,544 discloses a battery strength indicating and switch means on a battery which is coupled across the terminals of the battery and which is provided with an indicating means to indicate the strength of the battery and in addition, the battery strength indicating means is also provided with an in-line switch which can easily be depressed to complete the circuit so as to place the indicator means across the terminals of the cell and display the charge of the battery.

U.S. Pat. No. 5,059,895 discloses a battery voltmeter comprising:

(A) a dielectric layer;

(B) a conductive layer above or below one of the surfaces of the dielectric layer; and (C) a temperature sensitive color indicator layer in thermal contact with the conductive layer, characterized in that the conductive layer has (i) thermal insulating means under one of its surfaces and (ii) sufficient heat generating capacity to affect a change in the temperature sensitive color indicator layer. The voltmeter can be integrated into a label and attached directly to a battery.

U.S. Pat. No. 4,835,475 discloses an apparatus for indicating the electromotive force of a dry battery which comprises:

(i) a film base;

(ii) an electrically conductive layer disposed on one side of the film base, (iii) a protective layer disposed on the electrically conductive layer, and (iv) a thermochromic layer disposed on the other side of the film base.

An object of the present invention is to provide a battery tester device which is assembled with the battery label and which has few components thus making it easy to assemble.

Another object of the present invention is to provide a battery tester device integral with the battery label that is cost effective to produce and suitable for efficient automatic assembly operation.

Another object is to provide a method for assembly of the battery tester label onto a battery.

BACKGROUND OF THE INVENTION

The invention relates to a battery having a first terminal and a second terminal of opposite polarity; said battery at least partially encased with a nonconductive film having a top surface and a bottom surface and said film defining a first opening exposing a segment of the first terminal and a spaced apart second opening exposing a Segment of the second terminal; a plurality of openings disposed between said first opening and said second opening; a conductive circuit layer disposed and secured over the first opening, second opening and plurality of openings so that a first segment of the conductive circuit layer can be deflected through the first opening to contact the first terminal, a second segment of the conductive circuit layer can be deflected through the second opening to contact the second terminal and the remaining segment of the conductive circuit layer is unable to contact any part of the battery housing through the plurality of openings; a thermally sensitive material disposed in responsive contact with the conductive circuit layer such that when the first segment and second segment of the conductive circuit layer contact the first terminal and second terminal, respectively, of the battery, a current will flow through the conductive circuit layer heating the thermally sensitive material which in turn will indicate the charge condition of the battery.

The invention also relates to a method for preparing and attaching a battery test label to a battery comprising the steps:

(a) preparing a nonconductive base film having a top surface and a bottom surface and producing in said film a first opening, a second opening, and a plurality of spaced-apart openings between said first opening and said second opening with said plurality of openings each being smaller than the first opening and second opening;

(b) preparing a conductive circuit layer with a thermally sensitive material secured to and in thermal contact with the conductive circuit layer and securing the conductive circuit layer onto the top surface of the film and over the first opening, the second opening and plurality of openings such that a selected first area of the conductive circuit over the first opening can be deflected into and below said first opening, a selected second area of the conductive circuit over the second opening can be deflected into and below said second opening while the remaining conductive circuit layer over the plurality of openings cannot be deflected into and below the plurality of openings;

(c) optionally securing a nonconductive outer film over at least the top surface of the base film containing the conductive layer; and (d) adhering the bottom surface of the base film to the housing of a battery having a first terminal and second terminal of opposite polarity such that the first opening is positioned over the first terminal and the second opening is positioned over the second terminal so that said first selected area can be deflected to contact the first terminal and said second selected area can be deflected to contact the second terminal to complete an electrical circuit in which current will flow through the conductive circuit layer creating heat that will be detected and displayed by the thermally sensitive material.

The size of the plurality of openings can vary from 0.0001 square inch to 0.004 square inch and preferably from 0.0004 square inch to 0.002 square inch. For AAA size cells the size of the plurality of openings would be on the lower end of the range while the D size cells would generally be on the higher end of the range. The first and second openings could be sized from 0.001 square inch to 0.008 square inch and preferably from 0.003 square inch to 0.005 square inch. Again the smaller end of the range would be for the smaller size cells such as the AAA size cells. This is due to the different curvature of the cylindrical cells with the D-size cells having a larger diameter than the smaller size AAA cells. For example, AAA size cells could have the plurality openings sized 0.0001 to 0.0003 square inch while the first and second openings could be sized 0.001 to 0.003 square inch. AA size cells could have the plurality of openings sized 0.0003 to 0.001 square inch while the first and second openings could be sized 0.002 to 0.004 square inch. D size cells could have the plurality of openings sized 0.001 to 0.003 square inch while the first and second opening could be sized 0.003 to 0.008 square inch. The only requirement is that the size of the first and second openings be larger than the size of the plurality of openings so that the conductive circuit layer can be deflected through the first and second openings and not through the plurality of openings. Preferably, the second opening could be a slot or groove opening at the edge of the base film so that the conductive circuit could be deflected to contact the cover of the cell. Thus the size of the second opening could be considerably larger than the size of the first opening. For example the second opening could exceed 0.01 square inch.

In one embodiment of the invention, an outer film can be disposed over the base film containing the battery tester device and said base material and/or the outer film can contain printed and graphic design matter for the battery. A suitable outer film would be polyester, polyvinyl chloride or the like. The batteries useful in this invention are primary or secondary batteries that have positive and negative terminals. The batteries are generally comprised of an anode, a cathode and electrolyte contained in a sealed housing. The housing typically has an opening in one end that is sealed and closed with a cover. This cover is usually in electrical contact with either the cathode or anode to provide a terminal of the battery while the terminal of opposite polarity, generally the battery housing, is usually in electrical contact with the other electrode. The test device label of this invention in addition to providing a label for the battery, provides a test device that is integral with the label and thereafter becomes an integral part of the battery. The test device operates such that by depressing one or two selected areas of the conductive circuit layer, the circuit is completed between the terminals of the battery via the conductive circuit layer which in turn generates heat which is detected by the thermally sensitive material to provide a visual indication of the strength of the battery. If the conductive circuit layer is disposed close to the housing of the battery which is usually a metallic material, then such housing can be used as a heat sink. If this occurs, the heat generated in the conductive circuit layer may be insufficient to be properly detected by the thermally sensitive material and may thereby provide inaccurate information as to the strength of the battery. It has been proposed to use insulation means between the base material and the conductive circuit layer which will increase the thickness of the label. In the present invention, a plurality of a small openings are formed in the base film under the conductive circuit layer which will act as a thermal insulation for the conductive layer. The openings can be circular, square or have any polygonal shape. At the same time the openings are sufficiently small so that the conductive circuit layer upon being deflected will not protrude through the openings to contact the housing of the cell. Thus the segment of the base film will function as a thermal and electrical insulator for the conductive circuit layer. In this arrangement, a minimum number of parts are required to produce a battery label having an integral battery tester for checking whether the battery is charged.

The base film can be made of any desired dielectric polymer material. It is preferable to use a dielectric polymer material that will shrink when assembled on a battery. Generally, polyvinyl resins, polyolefin resins, polyester resins and the like would be suitable. Specific examples would be polyvinyl chloride, polyethylene, and polypropylene. The thickness of the film is not particularly limited but could be in the range of about 0.0005 to 0.005 inch, preferably 0.001 to 0.003 inch.

The electrically conductive circuit layer can be a metallic foil such as silver, nickel, iron, copper, lead, etc., and mixtures thereof or a metallized plastic layer. Other examples include electrically conductive polymers, paints or inks, such as those that contain graphite, carbon or metals such as silver or combinations thereof which could be applied onto a substrate as the conductive layer. Hot stamping of conductive material onto the substrate could also be used. Preferably the conductive circuit layer is formed as a separate part, preferably on a substrate, and shaped to have first and second segment ends that are connected to each other via an area of controlled resistivity. The first segment is provided to contact a first terminal of the battery and the second segment is provided to make contact with the second terminal of the battery. Thus, when the conductive circuit layer makes contact with both terminals of the battery, an electric current will flow through the area of controlled resistivity which will heat the conductive circuit layer to a range sufficient to activate the thermally sensitive material. The resistance in the area of controlled resistivity can vary or it can be constant dependent on the particular application of use.

The testing means also comprises a means for indicating the capacity of the battery. The indicating means will be in responsive contact with the area of controlled resistivity and will respond to and indicate the capacity of the battery. For example, a temperature will be generated in that area when a current flows through the conductive circuit layer. Thermally sensitive material will be in thermally transferable contact with the area of controlled resistivity and will indicate to the consumer the capacity of the battery. This indication can be qualitative such as a "good" reading, or quantitative such as a remaining percentage of useful life. The thermally sensitive materials could change color in response to a temperature change and such change in the material would be readily viewable by a consumer. Thus the consumer, based on the color change, can determine whether the battery is good or needs to be replaced. Examples of such thermally sensitive materials are liquid crystal materials and thermochromic inks. Examples of suitable liquid crystal materials are of the cholesteric type, such as cholesteryl oleate, cholesteryl chloride, cholesteryl caprylate and the like. Examples of suitable color thermochromic inks include those comprised of a dye, developer and desensitizing agent that are disclosed in U.S. Pat. No. 4,835,475, herein incorporated by reference. The color indicator material could change from colored to colorless, colorless to colored, or one color to a second color.

The indicating materials such as thermochromic inks can be used singly or in combination. For example, in one embodiment different layers of the indicating material could be employed. The layers are activated at different temperatures or states and can be designed to change different colors at different temperatures. For example, the layer of material activated at the highest temperature will preferably be the bottom layer, and the upper layers are arranged in decreasing temperatures of activation with lowest temperature material in the top layer.

Either one or both terminal contact segment ends of the conductive circuit could be out of contact with the respective terminals of the battery so that the tester circuit is open. In one embodiment of the invention either the anode or cathode is in electrical contact with the conductive housing of the battery. In this embodiment, one of the terminal contact segments ends of the tester circuit can be permanently connected to one terminal of the housing while the other contact end is positioned out of contact with the other terminal of the housing by an opening in the base layer disposed between the housing and the segment end of the tester circuit. This opening can act as a switch for the tester circuit. By forcing the circuit contact segment end into contact with the housing through the opening, the switch is closed and the tester circuit is completed to test the battery. This contact can be conveniently made by applying finger or thumb pressure to the switch areas.

The labels useful in this invention can also comprise additional insulative layers, printing layers, protective layers and the like. Suitable materials for use as the different layers are those typically used in battery labels and include plasticized or unplasticized polyvinyl chloride (UPVC), polyesters, metallic films, paper and like, and they are prepared by known methods, such as laminating the layers together. The label can be attached to the battery by the use of an adhesive. The tester label can be in the form of a single ply label or a shrinkable tube label in which a battery is encased.

A preferred tester label is comprised of a base insulative film adhered to the housing of the battery by a suitable adhesive. The housing is in electrical contact with either the anode or cathode of the battery. The insulative film has two openings in it for contact with the cell terminals. A separate tester circuit assembly is placed on the top surface of this insulative film and one of the terminal contact segment ends of the circuit is aligned with one of the openings in the base film. The other terminal contact segment end of the circuit is aligned with the second opening and is in contact with and secured to the terminal of the battery (generally the cover) that is not in contact with the housing. The area of the base film onto which the tester circuit is placed has a plurality of openings as described above to function as thermal insulation means for said tester circuit. The thermal indicating material is placed over the area of controlled resistivity of the circuit. The indicating material can be placed directly on the tester circuit or it can be placed on a separate layer that is placed over the tester circuit. Preferably, the indicating material is a thermochromic ink and is in thermally transferable contact with the area of controlled resistivity. Finally, a protective layer is placed over the indicating material. The type of protective layer is selected so that the indicating material can be observed by the user. To test the battery, the user will press the label at the point above one or both openings in the insulator film to establish contact with the terminals of the battery housing. As the circuit is completed, a temperature increase will be generated in the area of controlled resistivity which will be transferred to the indicating material, if the desired temperature level is reached, the indicating material will so indicate and the user can determine the amount of capacity remaining in the battery.

One way to dispense the test circuit label on the battery in a continuous operation is to first prepare a base film, such as a plastic film, made with graphics and printed matter on the top side along with a first opening, second opening and plurality of openings as discussed above. An adhesive was added to the bottom side which was then joined to a releasable material such as silkcone-coated release paper to form a label carrier. In a separate operation, a desired shaped circuit tester layer is deposited on a substrate along with a thermally sensitive material such as thermochromic ink and an adhesive has been added to the bottom surface of the substrate leaving the appropriate test circuit segment ends free of the adhesive. The adhesive side is joined with a releasable paper such as silicone-coated paper and then wound on a roll. The tester circuit roll containing the individual circuit tester devices is placed in a dispensing machine to feed the test circuit devices onto the base layer in a fixed time sequence. Means on the machine detects when the area of the label containing the openings reaches a specific location whereupon a test circuit device cut to a desired size is dispensed without the releasable paper web and positioned over and secured to the selected area of the base label. If desired, additional graphics could be printed on the base label and/or the test circuit layer before an outer layer is secured to the base layer. The completed base layer is cut to a desired size and then fed to another area where the silicone-coated paper web is removed and the label is secured to the housing of the battery. If desired, graphics could be placed on the outer layer of the label.

BRIEF DESCRIPTION OF THE INVENTION

Figure 1:
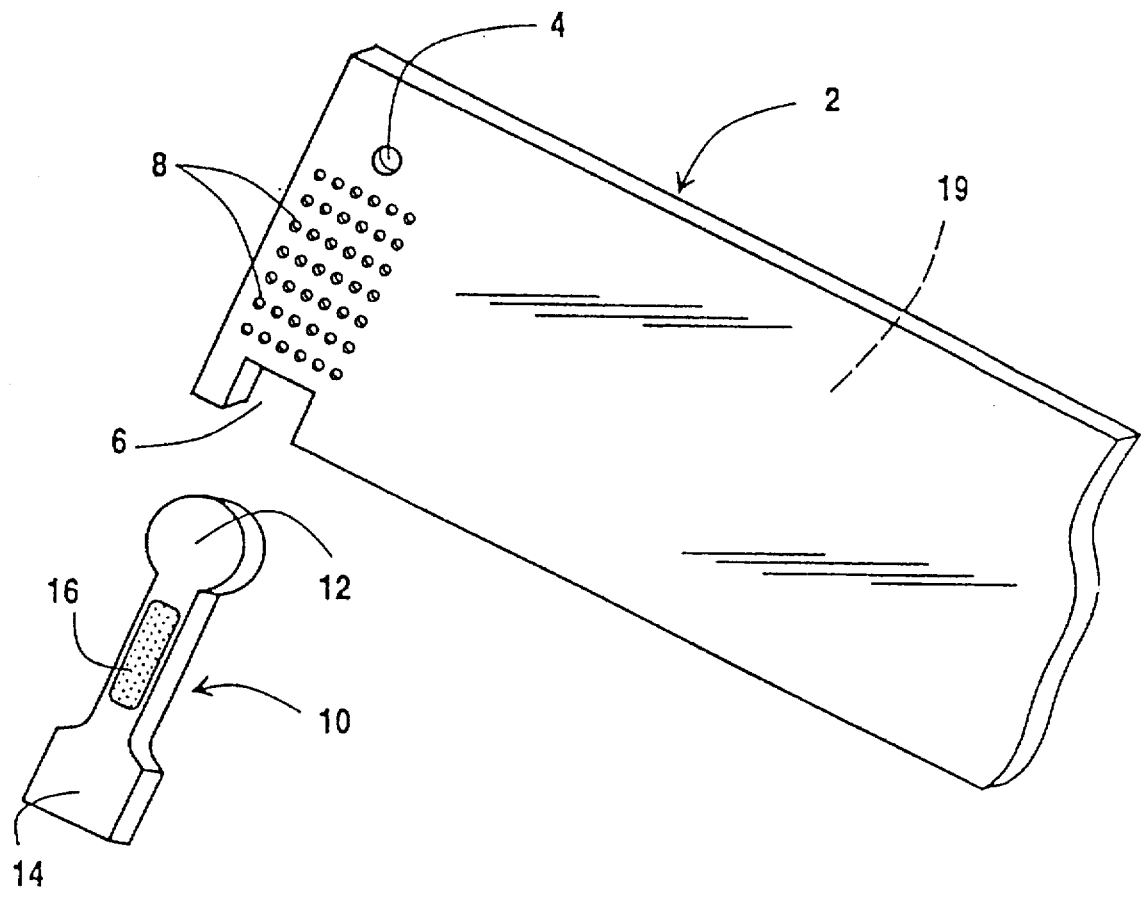
FIG. 1 is an exploded view of the various components of a test circuit labels of this invention.
Figure 2:
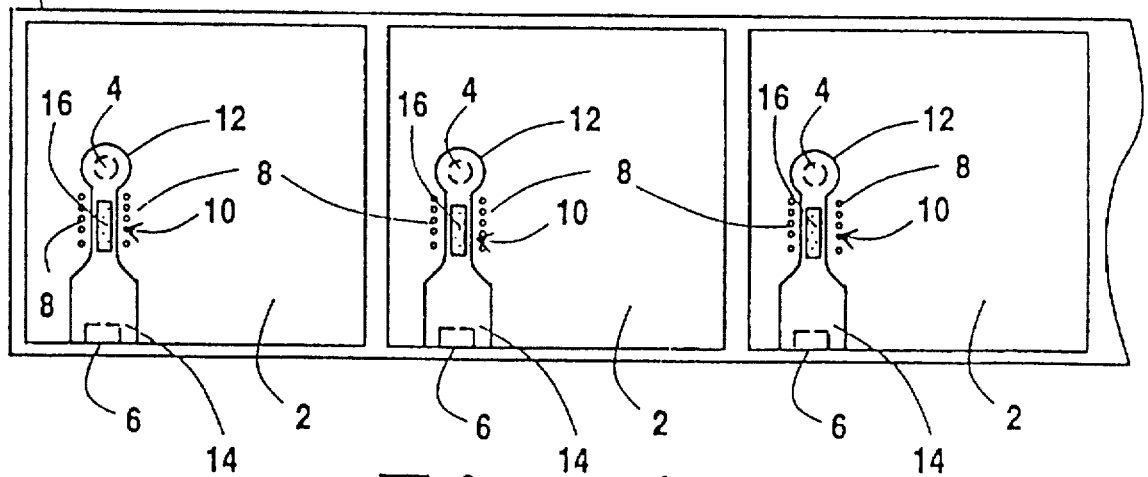
FIG. 2 is a plan view of a continuous sheet of label carrier containing the individual test circuit devices of this invention.
Figure 3:
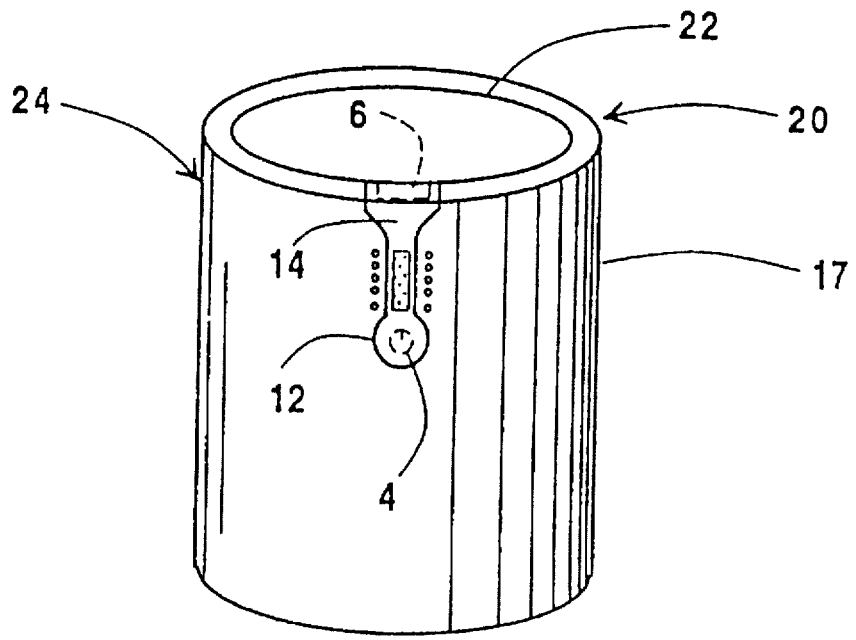
FIG. 3 is an isometric view of a cell employing the test circuit device of this invention.

Referring to FIG. 1 there is shown a base film 2 such as PVC, which has a first opening 4, a second opening 6 in the form of a slot and disposed between opening 4 and opening 6 is a plurality of small openings 8. A conductive layer 10 is selectively shaped so that it can be placed over opening 4, opening 6 and at least some of the plurality of openings 8. Opening 4 is sufficiently large so that conductive segment layer 12 can be depressed into and through opening 4. Opening 6 is in the form of a notch so that conductive segment layer 14 can be depressed into and through notch 6 to contact a terminal of the cell. On top of conductive layer 10 is a thermally sensitive material 16 such as a thermochromic material, which will change color upon detection of a particular temperature level. As shown in FIG. 2, a plurality of conductive layer devices 10 is shown secured on base film 2 releasably secured on a carrier layer 11, such as a silicone-coated paper, and disposed over opening 4, opening 6 and plurality of openings 8. Disposed on top of conductive layer 10 is thermally sensitive material 16. If desired, a nonconductive film or coating (not shown) could be disposed over base film 2 thereby further securing conductive layer 10 and thermally sensitive material to base film 2. This top layer could have an adhesive side to secure to the base film 2. This nonconductive film could be in the form of a tube that could be heat shrunk onto the cell after the label is applied to the cell. Base film 2 has an adhesive layer 19 on its bottom surface (see FIG. 1) which is secured to a battery as shown in FIG. 3. Specifically, FIG. 3 shows a battery test label 17 on base film 2 (not shown) secured to the housing of battery 20. Conductive segment layer 14 is in electrical contact with cover 22 which represents one terminal of battery 20. This conductive segment layer 14 can be permanently connected to conductive cover 22. The conductive segment layer 12 is disposed over opening 4 and is spaced apart from the cylindrical housing 24 of the battery 20 which is the second terminal of the battery 20. Thus the circuit between the two terminals of battery 20 via conductive segment layers 12 and 14 is open. To close the circuit, pressure is applied on the flexible upper layer above opening 4 in the base film. The pressure will cause the conductive segment layer 12 to make electrical contact with the battery housing 24 through opening 4. Rigidity and springback in the label will cause conductive segment layer 12 to break contact with housing 24 when the pressure is released. If desired, conductive segment layer 14 can also be spaced apart from the cover 22 so that to complete the circuit, pressure will have to be simultaneously applied to the flexible upper layer above both openings 4 and 6 in the base film. When the pressure is released, conductive layer segments 12 and 14 will spring back and break contact with the housing 24 and cover 22, respectively. As stated above, suitable graphics and printed matter can be placed on the base layer, conductive layer, thermally sensitive material and/or the outer layer.

Figure 4:
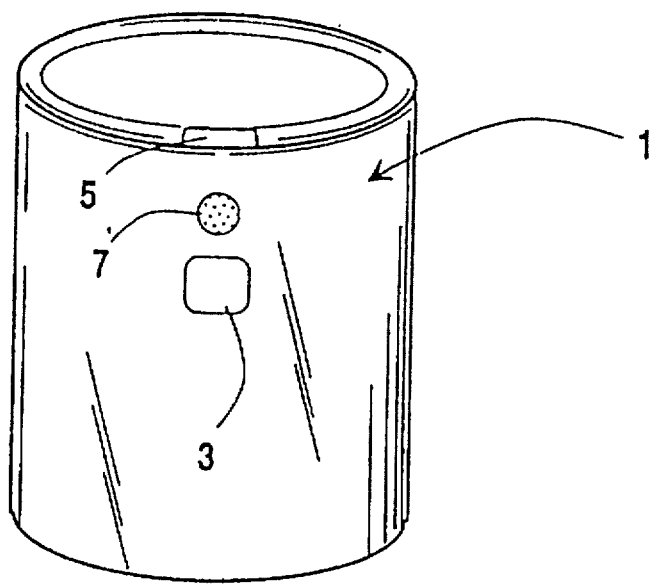
FIG. 4 is an isometric view of a cell employing the test circuit device of this invention encased in an outer layer.

As shown in FIG. 4, an outer layer 1 contains designated areas 3 and 5 which correspond to the first terminal area and second terminal area, respectively, of the cell. Designated area 7 exposes an area of the thermally sensitive material so that when areas 3 and 5 are depressed, a circuit is completed and the thermally sensitive material will change color to indicate the state of charge of the cell. If desired, either area 5 or 3 could be permanently secured to a terminal so that only area 3 or 5, respectively, would have to be depressed to complete the circuit.

This invention has been described in detail with particular reference to preferred embodiments thereof, but it will be understood that variations and modifications can be effected within the spirit and scope of the invention. For example, an adhesive strip could be secured over the conductive circuit layer containing the thermally sensitive material so that the conductive circuit layer could be secured to the base film using the adhesive strip.

What is claimed:

1. A battery having a first terminal and a second terminal of opposite polarity; said battery at least partially encased with a nonconductive film having a top surface and bottom surface and said film defining a first opening exposing a segment of the first terminal, a spaced apart second opening exposing a segment of the second terminal, and a plurality of openings between said first opening and said second opening and a conductive circuit layer disposed over the first opening, the second opening, and the plurality of openings so that a first segment of conductive circuit layer can be deflected through the first opening to contact the first terminal, a second segment of the conductive circuit layer can be deflected through the second opening to contact the second terminal with the remaining segment of the conductive circuit layer being unable to contact the terminals of the battery through the plurality of openings; a thermally sensitive material disposed in responsive contact with the conductive circuit layer such that when the first segment and second segment of the conductive circuit layer contact the first terminal and second terminal, respectively, a current will flow through the conductive circuit layer and heat the thermally sensitive material which will indicate the capacity of the battery.

2. The battery of claim 1 wherein the plurality of openings are each sized from 0.0001 square inch to 0.004 square inch.

3. The battery of claim 1 wherein the plurality of openings are each sized from 0.0004 square inch to 0.002 square inch.

4. The battery of claim 1 wherein the battery comprises a housing composed of a cylindrical container closed at one end and open at the opposite end and said container forming the first terminal of the battery; a cover secured over and electrically insulated from the open end of the container and said cover forming the second terminal of the battery, said first segment of the conductive circuit layer disposed over the first opening and spaced from the first terminal, and said second segment of the conductive circuit layer disposed over the second opening and spaced from the second terminal.

5. The battery of claim 1 wherein a heat shrunk film is secured over the battery.

6. The battery of claim 1 wherein the conductive circuit layer is selected from the group consisting of silver, nickel, iron, copper, carbon, and lead.

7. The battery of claim 6 wherein the conductive circuit layer is silver.

8. The battery of claim 1 wherein the thermally sensitive material is selected from the group consisting of thermochromic ink and liquid crystal material.

9. The battery of claim 7 wherein the thermally sensitive material is thermochromic ink.

10. The battery of claim 8 wherein the thermally sensitive material is thermochromic ink.

11. The battery of claim 1 wherein one segment of the conductive circuit layer is permanently secured to the terminal.

12. The battery of claim 1, wherein the conductive circuit layer is selected from the group consisting of conductive paints, conductive polymers, conductive inks, and mixtures thereof.

13. A method for preparing and attaching a battery test label to a battery comprising the steps:

(a) preparing a nonconductive base film having a top surface and a bottom surface and producing in said film a first opening, a second opening and a plurality of spaced-apart openings between said first opening and said second opening with said plurality of openings each being smaller than the first and second openings;

(b) securing a thermally sensitive material to the top surface of a conductive circuit layer and securing the bottom surface of the conductive circuit layer onto the top surface of the base film and over the first opening, 5he second opening and at least a portion of the plurality of openings such that a selected first area of the conductive circuit layer can deflect into and through said first opening, a selected second area of the conductive circuit layer can deflect into and through the second opening, and the conductive circuit layer cannot be deflected through the plurality of openings; and (c) adhering the bottom surface of the base film to the housing of a battery having a first terminal and second terminal of opposite polarity such that the first opening is positioned over the first terminal and the second opening is positioned over the second terminal so that said first selected area can be deflected to contact only the first terminal and said second selected area can be deflected to contact the second terminal to complete an electrical circuit between the terminals that will cause current to flow through the conductive circuit layer creating heat that will be detected by the thermally sensitive material.

14. The method for claim 13 wherein in step (a) the base film has an adhesive layer on its bottom surface and a releasable film disposed over the adhesive layer and in step (c) the releasable film is removed and the bottom surface of the base film is secured to the housing of the battery using the adhesive layer.

15. The method of claim 13 wherein in step (b) the bottom surface of the conductive circuit layer has an adhesive layer with the selected first area of the conductive circuit layer and the selected second area of the conductive circuit layer free of said adhesive, and a releasable layer film disposed over the adhesive layer and in step (b) the releasable layer is removed prior to securing the conductive circuit layer to the base film using the adhesive layer.

16. The method of claim 13 wherein the following step is added:

d) securing a nonconductive film over the base film containing the conductive circuit layer and thermally sensitive material.

17. The method of claim 13 wherein in step (a) the first opening is an enclosed defined opening and the second opening is a slot at the edge of the base film.

18. The method of claim 13 wherein in step (a) the plurality of openings are each sized from 0.0001 square inch to 0.004 square inch.

19. The method of claim 13 wherein in step (b) the conductive circuit layer is silver.

20. The method of claim 13 wherein in step (a) the thermally sensitive material is a thermochromic ink.

21. The method of claim 16 wherein in step (a) the conductive circuit layer is silver and the thermally sensitive material is thermochromic ink.

* * * * *